(12) United States Patent
Matsuda et al.

(10) Patent No.: US 8,033,654 B2
(45) Date of Patent: Oct. 11, 2011

(54) PIEZOELECTRIC ELEMENT, INK JET HEAD AND PRODUCING METHOD FOR PIEZOELECTRIC ELEMENT

(75) Inventors: Takanori Matsuda, Chofu (JP);
Toshihiro Ifuku, Yokohama (JP);
Kenichi Takeda, Yokohama (JP);
Katsumi Aoki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/893,726

(22) Filed: Sep. 29, 2010

(65) Prior Publication Data

US 2011/0018945 A1    Jan. 27, 2011

Related U.S. Application Data

(63) Continuation of application No. 11/774,145, filed on Jul. 6, 2007, now Pat. No. 7,874,649.

(30) Foreign Application Priority Data

Jul. 14, 2006    (JP) ................................. 2006-194699

(51) Int. Cl.
*B41J 2/045*    (2006.01)
(52) U.S. Cl. ....................................................... 347/68
(58) Field of Classification Search .................... 347/68, 347/70–72; 29/25.35
See application file for complete search history.

(56) References Cited

U.S. PATENT DOCUMENTS

| 6,198,208 | B1 | 3/2001 | Yano et al. |
| 7,528,532 | B2 | 5/2009 | Ifuku et al. |
| 7,874,649 | B2 * | 1/2011 | Matsuda et al. ................ 347/68 |
| 2007/0046153 | A1 | 3/2007 | Matsuda et al. |
| 2007/0060467 | A1 | 3/2007 | Matsuda et al. |
| 2007/0090728 | A1 | 4/2007 | Matsuda et al. |
| 2007/0215715 | A1 | 9/2007 | Fukui et al. |
| 2008/0012054 | A1 | 1/2008 | Ifuku et al. |
| 2009/0128608 | A1 | 5/2009 | Fukui |

FOREIGN PATENT DOCUMENTS

| JP | 08-116103 A | 5/1996 |
| JP | 2000-332569 A | 11/2000 |
| JP | 2003-98124 A | 4/2003 |
| JP | 2005-119166 A | 5/2005 |

* cited by examiner

*Primary Examiner* — An Do
(74) *Attorney, Agent, or Firm* — Fitzpatrick, Cella, Harper & Scinto

(57) ABSTRACT

A piezoelectric element includes a piezoelectric film disposed on a substrate and a pair of electrodes disposed in contact with the piezoelectric film and utilizing a bending mode. The piezoelectric film includes domains constituted of a tetragonal crystal and including an a-domain which is formed by a crystal having a (100) plane parallel to the film surface of the piezoelectric film, the a-domains include an A-domain having a normal axis of (001) plane substantially parallel to a principal bending direction of the piezoelectric film and a B-domain having a normal axis of (001) plane substantially perpendicular to the principal bending direction of the piezoelectric film, and the A-domains have a volume proportion larger than 50 vol % with respect to the sum of the volume of the A-domains and the volume of the B-domains.

6 Claims, 7 Drawing Sheets

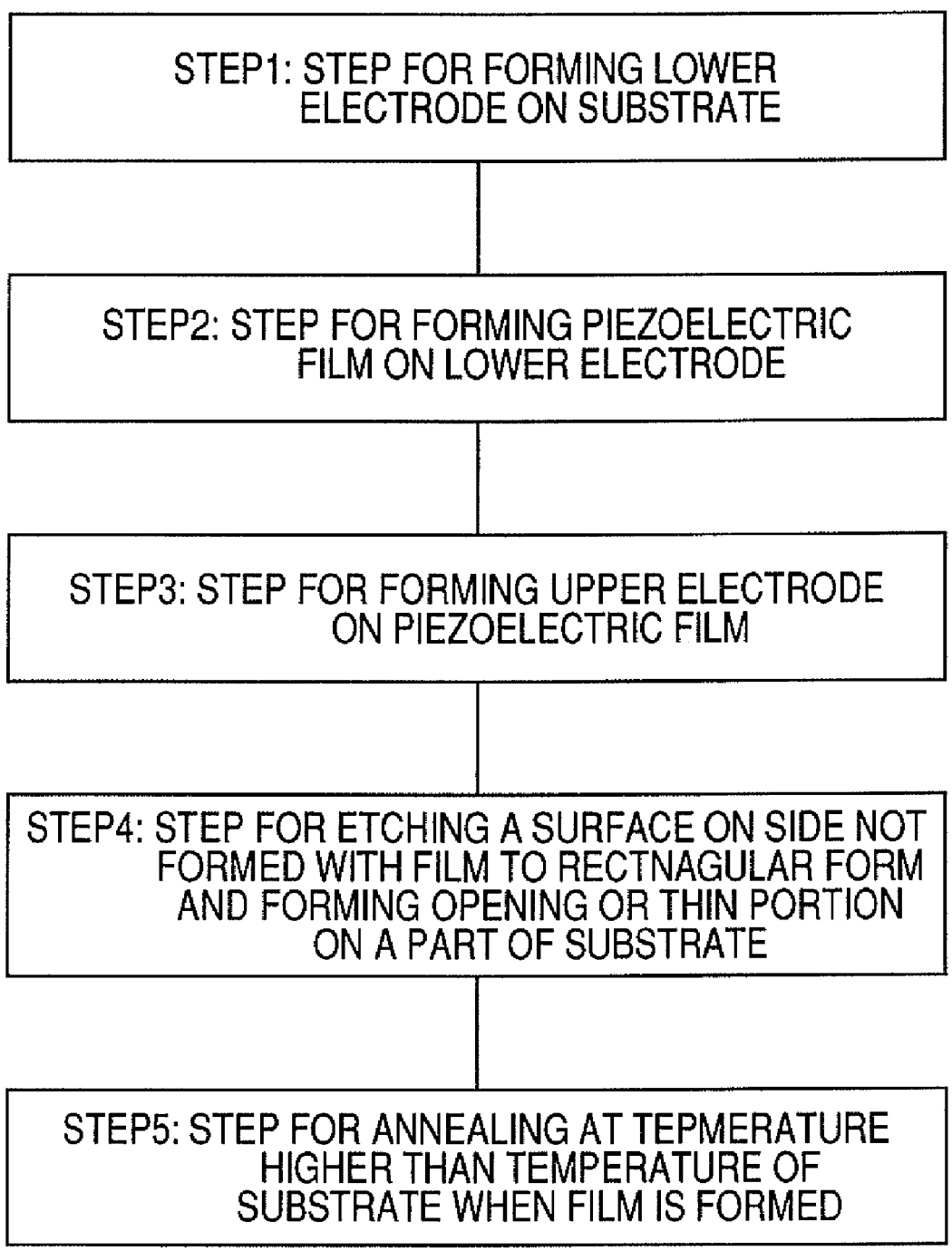

PIEZOELECTRIC ELEMENT, INK JET HEAD AND PRODUCING METHOD FOR PIEZOELECTRIC ELEMENT

This application is a continuation of U.S. patent application Ser. No. 11/774,145, filed Jul. 6, 2007, now U.S. Pat. No. 7,874,649, which issued on Jan. 25, 2011.

BACKGROUND OF THE INVENTION

1. Field of the Invention

The present invention relates to a piezoelectric element and an ink jet head, for use in an ink jet recording apparatus, and to a producing method for a piezoelectric element.

2. Description of the Related Art

The piezoelectric element is an element capable of converting an electric energy into a mechanical energy such as mechanical displacement, stress or vibration, and also of a reverse conversion, and is available for example in unimorph type and bimorph type, depending on the generated bending displacement. Such piezoelectric element is widely utilized for example in an ink jet head of an ink jet recording apparatus, a microphone, a sound generating device (such as a speaker), various vibrators, oscillators and sensors. Recently, a printer utilizing an ink jet head is widely utilized as a printing apparatus of personal computers and the like, because of a satisfactory printing performance, an easy handling and a low cost. Such ink jet head includes various types, such as one that generates a bubble by thermal energy in a liquid such as an ink and discharges a liquid droplet by a pressure wave caused by such bubble, one that discharges a liquid droplet by an electrostatic suction force, and one that utilizes a pressure wave generated by a vibrator such as a piezoelectric element.

As an ink jet head utilizing a piezoelectric element, one illustrated in FIG. 1 is known. In the ink jet head illustrated in FIG. 1, on a substrate 41 including an array of plural pressure chambers 61, a piezoelectric film 45 formed continuously in such a size as to cover two or more pressure chambers 61 is provided, across a vibration plate 42. At least either of an upper electrode 46 and a lower electrode 44, which are disposed to sandwich the piezoelectric film 45 at the upper and lower sides thereof, is formed separately for each pressure chamber 61, whereby a piezoelectric drive area is formed, in the piezoelectric film 45, for each pressure chamber 61. Such piezoelectric drive area is made smaller than the corresponding pressure chamber 61 in a planar direction parallel to the piezoelectric film 45, and is positioned with a gap to the peripheral edge and over the entire periphery of the pressure chamber 61. A predetermined voltage is applied to the piezoelectric film 45 to cause an elongation or a contraction of the piezoelectric film 45 and to induce a bending vibration in the vibration plate 42, thereby pressurizing a liquid such as an ink in the pressure chamber 61 and discharging a liquid droplet from a liquid discharge port 53.

Along with the recent pervasiveness of color ink jet printers, there are being requested an improvement in the printing performance, a higher resolution, a higher printing speed and a longer-sized ink jet head. For this purpose, it is being requested to realize an ink jet head in a miniaturized multi-nozzle head structure. In order to miniaturize the liquid discharge head, it is necessary to realize a smaller piezoelectric element for liquid discharge, and, for realizing a smaller piezoelectric element, there is required a piezoelectric element having a high piezoelectric constant, that does not lose the driving ability even when miniaturized.

As the piezoelectric film for use in the piezoelectric element, conventionally employed is a PZT type piezoelectric material which is obtained by molding a paste of PbO, $ZrO_2$ and $TiO_2$ powder into a sheet shape as a green sheet, followed by a sintering. However, the PZT type oxide film obtained by this method is difficult to prepare with a thickness of 10 μm or less. Also since the green sheet is sintered at a temperature of 1000° C. or higher, there results a problem that the piezoelectric film shrinks to about 70% when heated. As it is difficult to align the piezoelectric film and the structural member such as the ink chamber with a dimensional precision in the order of several micrometers, a satisfactory compact piezoelectric element has not been obtained.

Other already reported methods for preparing the piezoelectric film include processes for preparing an oxide piezoelectric film, such as a sputtering process, a chemical vapor deposition process (also represented as CVD process), a molecular beam epitaxy process (also represented as MBE process), or a sol-gel process. These methods allow to obtain a piezoelectric film of a thickness of 10 μm or less.

However, such film forming methods as sputtering, CVD process, MBE process or sol-gel process involve a drawback of being incapable of preparing a thin film comparable in characteristics to bulk ceramics. In order to solve this drawback, for example Japanese Patent Application Laid-Open No. H08-116103 proposes a method of controlling the crystal orientation to a (001) plane, and Japanese Patent Application Laid-open No. 2000-332569 proposes a producing method for an epitaxial film having a domain structure, in which (100) and (001) orientations of a tetragonal crystalline structure are mixed. Also Japanese Patent Application Laid-Open No. 2005-119166 proposes a method of forming a (100) orientation by an orientation control layer and controlling the residual stress at zero or at a compression stress.

However, even with the method of Japanese Patent Application Laid-Open No. H08-116103, the characteristics comparable to those of bulk ceramics cannot be obtained at a high electric field side so that the obtained piezoelectric element is insufficient in the performance.

Also the method disclosed in Japanese Patent Application Laid-Open No. 2000-332569 involves drawbacks of being unable to utilize a morphotropic phase boundary range (also represented as MPB range) of satisfactory characteristics and being unable to reproducibly control a proportion of (100) orientation and (001) orientation. Also in a film having an excessively large proportion of (100) orientation or namely of [100] axis, a contribution of the 90° domain effect becomes large whereby the film becomes inferior in durability in a thin film element.

The "90° domain effect" means utilizing a 90° domain in which, in a tetragonal crystalline structure, an a-domain of (100) orientation and a c-domain of (001) orientation are mixedly present. This effect is caused by reversible changes of from a-domain to c-domain and from c-domain to a-domain, and by a distortion resulting from a difference in the lattice constants, and shows a piezoelectric constant far larger than in an ordinary elongation-contraction in the polarization direction.

Also the method of Japanese Patent Application Laid-Open No. 2005-119166 is incapable of controlling (100) orientation and (001) orientation, and is incapable of forming a 90° domain having an anisotropy within the plane of the piezoelectric film.

SUMMARY OF THE INVENTION

Consequently, the present invention is to solve the aforementioned problems, and an object thereof is to provide a piezoelectric element having a high piezoelectric characteristic and a satisfactory durability, an ink jet head utilizing the same and excellent in displacement controllability and durability, and a producing method for such piezoelectric element.

The piezoelectric element of the present invention, capable of solving the aforementioned problems, is a piezoelectric element including a piezoelectric film disposed on a substrate and a pair of electrodes disposed in contact with the piezoelectric film and utilizing a bending mode, wherein the piezoelectric film includes domains constituted of a tetragonal crystal and including an a-domain which is formed by a crystal having a (100) plane parallel to the film surface of the piezoelectric film, wherein the a-domains include an A-domain having a normal axis of (001) plane substantially parallel to a principal bending direction of the piezoelectric film and a B-domain having a normal axis of (001) plane substantially perpendicular to the principal bending direction of the piezoelectric film, and wherein the A-domains have a volume proportion larger than 50 vol % with respect to the sum of the volume of the A-domains and the volume of the B-domains.

The ink jet head of the present invention is characterized in including the piezoelectric element of the present invention.

Also the producing method of the present invention for the piezoelectric element is a method for producing a piezoelectric element having a piezoelectric film disposed on a substrate and a pair of electrodes disposed in contact with the piezoelectric film, including in succession in the order of forming the piezoelectric film on the substrate, forming a rectangular aperture on a surface of the substrate at a side where the piezoelectric film is not formed, and heating the substrate at a temperature higher than the temperature of the substrate at the formation of the piezoelectric film, wherein the substrate has a linear thermal expansion coefficient larger than that of the piezoelectric film at a stage before the heating.

The present invention enables to provide a piezoelectric element having a high piezoelectric characteristic, excellent in displacement controllability and satisfactory in durability. The present invention also enables to provide an ink jet head excellent in stability and power of ink discharge.

Further features of the present invention will become apparent from the following description of exemplary embodiments with reference to the attached drawings.

BRIEF DESCRIPTION OF THE DRAWINGS

FIG. 6 is a block diagram illustrating a production process of the present invention.

DESCRIPTION OF THE EMBODIMENTS

Now the present invention will be clarified in detail.
(Piezoelectric Element)
The piezoelectric element of the present invention is, as described above, a piezoelectric element including a piezoelectric film disposed on a substrate and a pair of electrodes disposed in contact with the piezoelectric film and utilizing a bending mode. The piezoelectric film has domains constituted of a tetragonal crystal. In the present invention, a domain constituted of a crystal having a (100) plane parallel to the film plane of the piezoelectric film is called an a-domain, and a domain constituted of a crystal having a (001) plane parallel to the film plane of the piezoelectric film is called a c-domain. Also in the present invention, among the a-domains, a domain having a normal axis of (001) plane substantially parallel to a principal bending direction of the piezoelectric film is called an A-domain, and a domain having a normal axis of (001) plane substantially perpendicular to the principal bending direction of the piezoelectric film is called a B-domain.

In the piezoelectric element of the present invention, the piezoelectric film is characterized in that the A-domains have a volume proportion larger than 50 vol % with respect to the sum of the volume of the A-domains and the volume of the B-domains. In the piezoelectric film, the volume proportion is preferably larger than 60 vol % and more preferably larger than 80 vol %.

Figure 2:
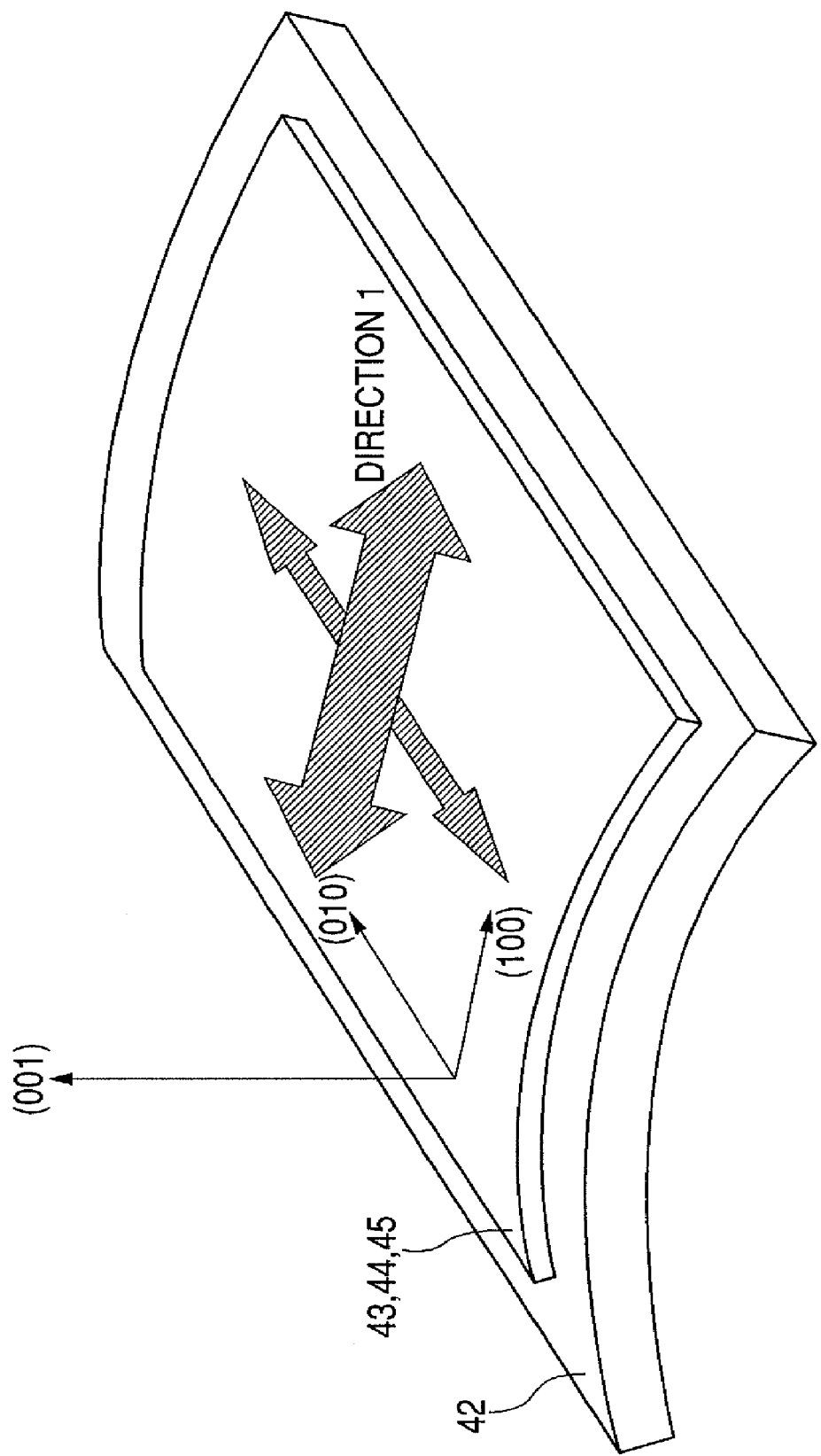
FIG. 2 is a schematic view for describing a principal bending direction (direction 1) in an exemplary embodiment of a piezoelectric element of the present invention.

The "principal bending direction of piezoelectric film" means, in a piezoelectric element of bending mode as illustrated in FIG. 2, when the piezoelectric element is distorted under a voltage application, a direction in which the curvature becomes largest (direction 1 in FIG. 2). Also "substantially parallel to the principal bending direction of piezoelectric film" means a direction within ±6° with respect to the direction 1. Also "substantially perpendicular to the principal bending direction of piezoelectric film" means a direction within ±6° with respect to a direction perpendicular to the direction 1.

The piezoelectric element is a piezoelectric element of a bending mode, in which the piezoelectric film has domains constituted at least of a tetragonal crystal. Also the piezoelectric film is so constructed that the A-domains have a volume proportion larger than 50 vol % with respect to the sum of the volume of the A-domains and the volume of the B-domains. This provides the piezoelectric element of the present invention with a very large displacement. This is presumably because the 90° domain is formed by the relaxation of compression stress in such a manner that the proportions of A-domains, formed by a crystal having a normal axis of (001) plane substantially parallel to the principal bending direction of the piezoelectric element, thereby increasing the bending amount in such direction and providing a very large displacement.

Figure 3:
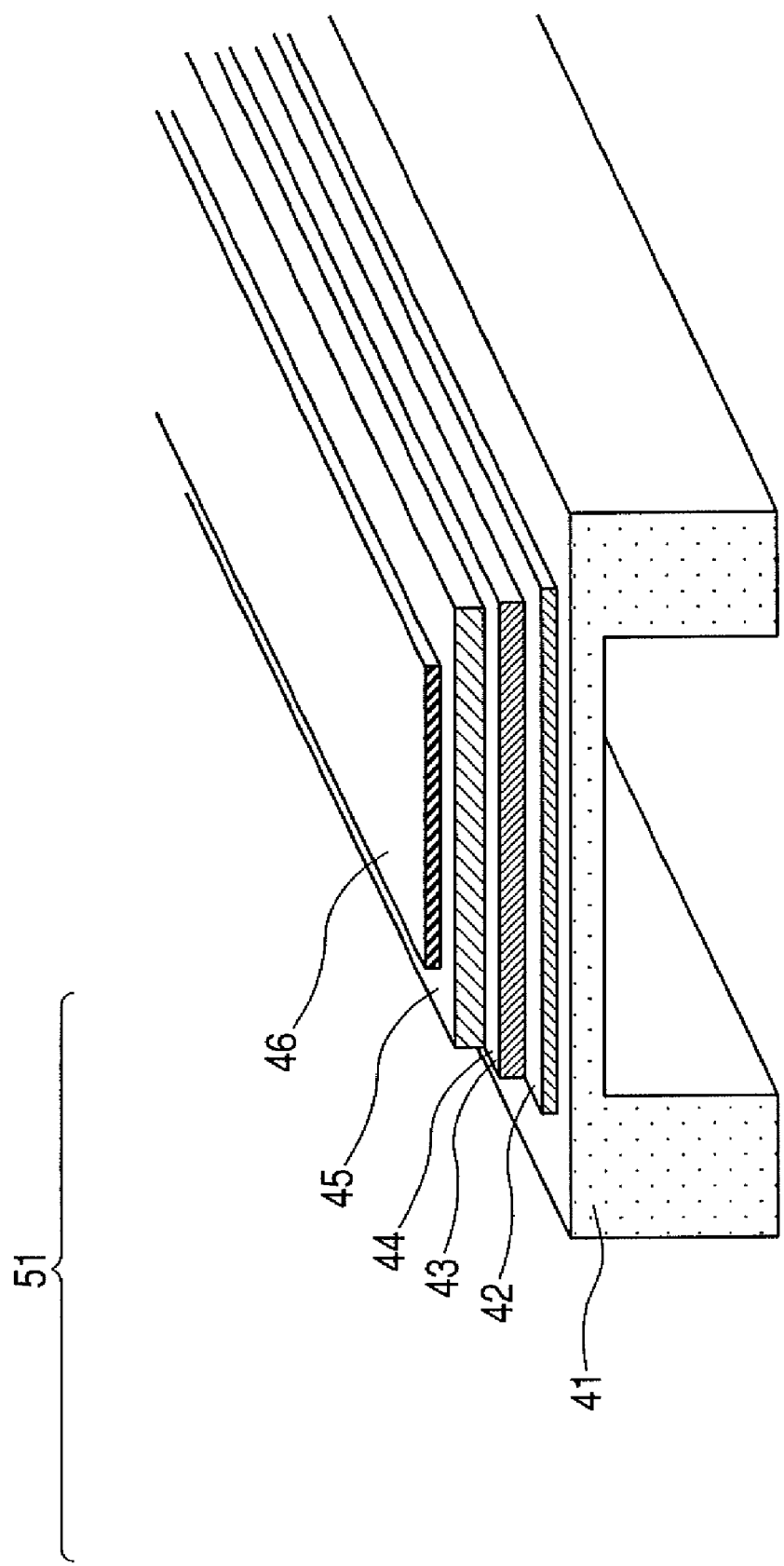
FIG. 3 is a schematic view illustrating a cross-sectional structure of an exemplary embodiment of the piezoelectric element of the present invention.

The piezoelectric element of the present invention is not particularly restricted so far as it has the construction described above. FIG. 3 illustrates an exemplary embodiment of the piezoelectric element of the present invention. The piezoelectric element of the exemplary embodiment illustrated in FIG. 3 has a laminate structure, in which a substrate 41, a vibration plate 42, a buffer layer 43, a lower electrode 44, a piezoelectric film 45 and an upper electrode 46 are laminated in succession. The substrate 41 may be partially etched, on a rear surface side where the piezoelectric film is not formed, for example in a rectangular form to form an aperture in a part of the substrate. Otherwise, as illustrated in FIG. 3, a thin portion of a thickness of from 2 to 10 µm, serving as a vibration plate of the piezoelectric element, may be formed in the substrate and may be made to function as a vibration plate in cooperation with the vibration plate 42 disposed thereon.

The substrate in the piezoelectric element of the present invention is preferably formed by a material of a satisfactory crystallinity, for example Si. A specific example is SOI prepared by forming a $SiO_2$ film on Si. Also preferred is $SrTiO_3$ having a linear thermal expansion coefficient larger than in the piezoelectric film. The substrate may have a thickness for example within a range of from 100 to 1000 μm.

The vibration plate is provided in order to transmit the displacement of the piezoelectric film, and preferably has a high lattice matching with the substrate and a sufficiently high Young's modulus in order to function as a vibration plate. The material for the vibration plate can be, for example, stabilized zirconia or $SrTiO_3$. Also in case of employing SOI as the substrate, the $SiO_2$ layer on the Si single crystal layer may be utilized as the vibration plate. Also as described above, a layer formed by summing a part of the substrate and the buffer layer may be used as the vibration plate. The vibration plate preferably has a thickness for example of from 2 to 10 μm.

The buffer layer is provided also for achieving a lattice matching between the crystal lattice constant of the substrate and the crystal lattice constant of the piezoelectric film, and may be dispensed with when the substrate and the piezoelectric film have a satisfactory lattice matching with each other. Also the buffer layer of the present invention has an important role of applying a compression stress to the piezoelectric film, a material capable of applying a compression stress is selected preferably. The buffer layer may be constructed as a single-layered structure or as a laminate structure including plural layers, in order to accomplish its function. The buffer layer is preferably formed by a material, having a high crystal lattice matching property with the vibration plate disposed immediately thereunder. In the case that the substrate is formed by Si, there is preferred, for example, stabilized zirconia YSZ ($Y_2O_3$—$ZrO_2$), $CeO_2$ or $SrTiO_3$. Also in the case that the substrate is formed by $SrTiO_3$, the buffer layer is not essential because the lattice constant of the substrate has a satisfactory matching with the piezoelectric film, but it may still be provided.

The lower electrode may be disposed immediately on the buffer layer 43 as illustrated in FIG. 3, or disposed between the vibration plate 42 and the buffer layer 43. Also in the case that the buffer layer is not provided, it may also have a function serving as a buffer layer, and, in such case, the lower electrode may be disposed on the vibration plate across an adhesion layer for improving the adhesivity. The lower electrode is preferably formed by a metal of platinum group or an electroconductive material of oxides thereof. Specific examples of the material for the lower electrode include platinum group metals such as Ru, Rh, Pd, Os, Ir and Pt, and oxide conductive materials such as $SrRuO_3$, $LaScCoO_3$, $BaPbO_3$ and $RuO_3$.

Examples of the material for the adhesion layer include metals such as Ti, Cr and Ir, and oxides thereof such as $TiO_2$ and $IrO_2$.

Such lower electrode 44, as influencing the crystalline orientation of the piezoelectric film to be formed thereon, preferably has, on the surface of the lower electrode, a preferred crystalline orientation of [100], [110] or [111]. When the surface of the lower electrode has a preferential crystalline orientation of [100], [110] or [111], the piezoelectric film 45 formed thereon has a preferred crystalline orientation of [100] or [001], oriented parallel to the film surface of the piezoelectric film.

In such lower electrode, the crystalline orientation rate is preferably 80% or higher. The crystalline orientation rate means, when the lower electrode has a preferred crystalline orientation of [100] in an XRD (X-ray diffractometry) θ-2θ measurement, a ratio of the integrated intensity of an (n00) peak to the integrated intensity of peaks in all the orientations; similarly for a preferred crystalline orientation of [110], a ratio of the integrated intensity of an (nn0) peak to the integrated intensity of peaks in all the orientations; and, for a preferred crystalline orientation of [111], a ratio of the integrated intensity of an (nnn) peak to the integrated intensity of peaks in all the orientations. When the lower electrode has a crystalline orientation rate of 80% or higher, the lower electrode has satisfactory electrical characteristics and the piezoelectric film 45 formed thereon will have an excellent crystallinity. More preferably, the lower electrode has a crystalline orientation rate of 90% or higher.

Also the lower electrode preferably has a film thickness of from 100 nm to 1000 nm. Also the adhesion layer, when provided, preferably has a film thickness of from 5 nm to 300 nm, more preferably from 10 nm to 70 nm.

In the piezoelectric element of the present invention, the piezoelectric film is preferably formed by a piezoelectric material represented by a following chemical formula (1):

$$(Pb_{1-x}M_x)_{xm}(Zr_yTi_{1-y})O_z \quad (1)$$

wherein M represents any one element selected from La, Ca, Ba, Sr, Bi, Sb, W and Nb; and x, xm, y and z represent real numbers respectively satisfying relations $0 \leq x < 0.2$, $1.0 \leq xm \leq 1.3$, $0.40 \leq y < 0.65$ and $2.5 \leq z \leq 3.0$. Specific examples of the piezoelectric material include:

$$(Pb_{0.94}La_{0.06})_{1.2}(Zr_{0.45}Ti_{0.55})O_3 \text{ and}$$

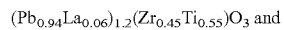

$$(Pb_{0.85}La_{0.15})_{1.2}(Zr_{0.45}Ti_{0.55})O_3.$$

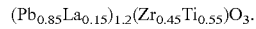

In the piezoelectric element of the present invention, it is preferable, as the material for the substrate or the buffer layer, to select a material having a linear thermal expansion coefficient larger than that of the piezoelectric film. In this manner, when the rear side of the substrate, where the piezoelectric film is not formed, is etched to form an aperture or a thin portion (thin portion preferably having a thickness of from 1 to 10 μm) thereby forming a vibration plate, the piezoelectric film is relaxed from the compression stress, applied to the piezoelectric film prior to the etching.

FIG. 6 is a block diagram illustrating a production process of the present invention, and FIGS. 7A to 7E are cross-sectional views illustrating the production process of the present invention. In the present invention, after the rear surface side of the substrate is etched to form an aperture or a thin portion in a part of the substrate (step (4) in FIG. 6 and FIG. 7D), the piezoelectric film is subjected to a heating treatment at a temperature higher than the temperature of the substrate at the formation of the piezoelectric film (step (5) in FIG. 6 and FIG. 7E). In this manner, a 90° domain, in which the a-domains and c-domains are mixedly present, is formed in the piezoelectric film.

Further in the present invention, after the formation of the piezoelectric film and when the vibration plate is formed by etching the rear surface side of the substrate to form the aperture or the thin portion in a part of the substrate, such aperture or thin portion is not formed in a circular shape completely isotropic in the planar direction but is formed into a shape having a longer side and a shorter side. In the case that the aperture or the thin portion is formed into such shape, when the 90° domain is formed by the heating treatment, the compression stress is more relaxed in the direction of longer side than in the direction of shorter side, thereby generating an anisotropy in the planar direction of the a-domain. In this state, a-domain having a normal axis of (001) plane in a direction same as the direction of shorter side is called an A-domain, and a-domain having a normal axis of (001) plane in a direction same as the direction of longer side is called a B-domain.

In this state, the volume of A-domains increases relative to the volume of B-domains. In such piezoelectric element, a larger piezoelectric constant which is governing for obtaining a larger displacement lies in the direction of shorter side, so that the A-domains contribute larger to the displacement than in the isotropic ones. Therefore the piezoelectric film of the present invention is so constructed, in order to utilize the large piezoelectric constant by the 90° domain, as to increase the number of 90° domains in a direction in which a larger distortion is desired.

In the piezoelectric film of the present invention, a-domain, c-domain, twin crystal structure and volume proportions thereof can be confirmed by a reverse lattice mapping of X-ray diffractometry or a polar point measurement of symmetrical plane. Measurement is also possible by a method described in Japanese Patent Application Laid-Open No. 2003-098124. Also the crystalline phase can be judged by reverse lattice mapping of X-ray diffractometry. An epitaxial single crystal film or a uniaxially aligned film can be confirmed by an X-ray diffraction θ-2θ method, a rocking curve method and a polar point measurement of non-symmetrical plane. The crystalline structure of the piezoelectric film can be easily confirmed by an X-ray diffractometry as described above, but may also be confirmed for example by a cross-sectional observation under a transmission electron microscope (also represented as TEM).

Also a composition ratio of the piezoelectric film, such as Zr/(Zr+Ti), can be confirmed by a compositional analysis by an induction-coupled plasma emission analyzer (also represented as ICP compositional analysis) or by a fluorescent X-ray analysis.

Figure 4:
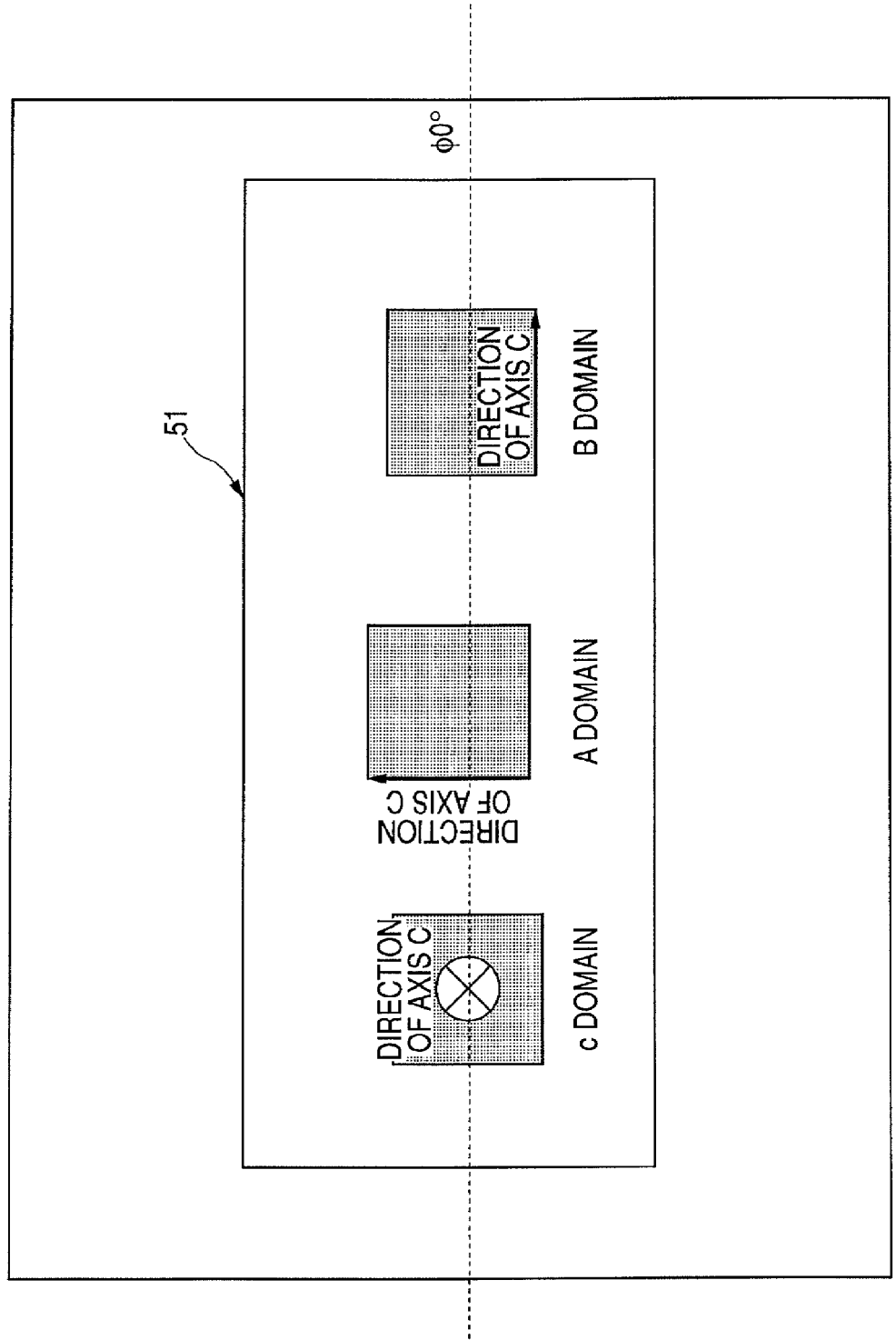
FIG. 4 is a plan view illustrating definitions of domain structures in the piezoelectric element of the present invention.

The volume ratio of A-domains relative to the sum of the volumes of A-domains and B-domains can be calculated for example by a following method. At first, a shorter side direction and a longer side direction of the piezoelectric element, as seen from the direction of film thickness, are defined as illustrated in FIG. 4. Then a domain constituted of a crystal having a c-axis parallel to the direction of film thickness is defined as a c-domain, while a domain having a c-axis parallel to the shorter side direction is defined as an A-domain, and a domain having a c-axis parallel to the longer side direction is defined as a B-domain.

Figure 5:
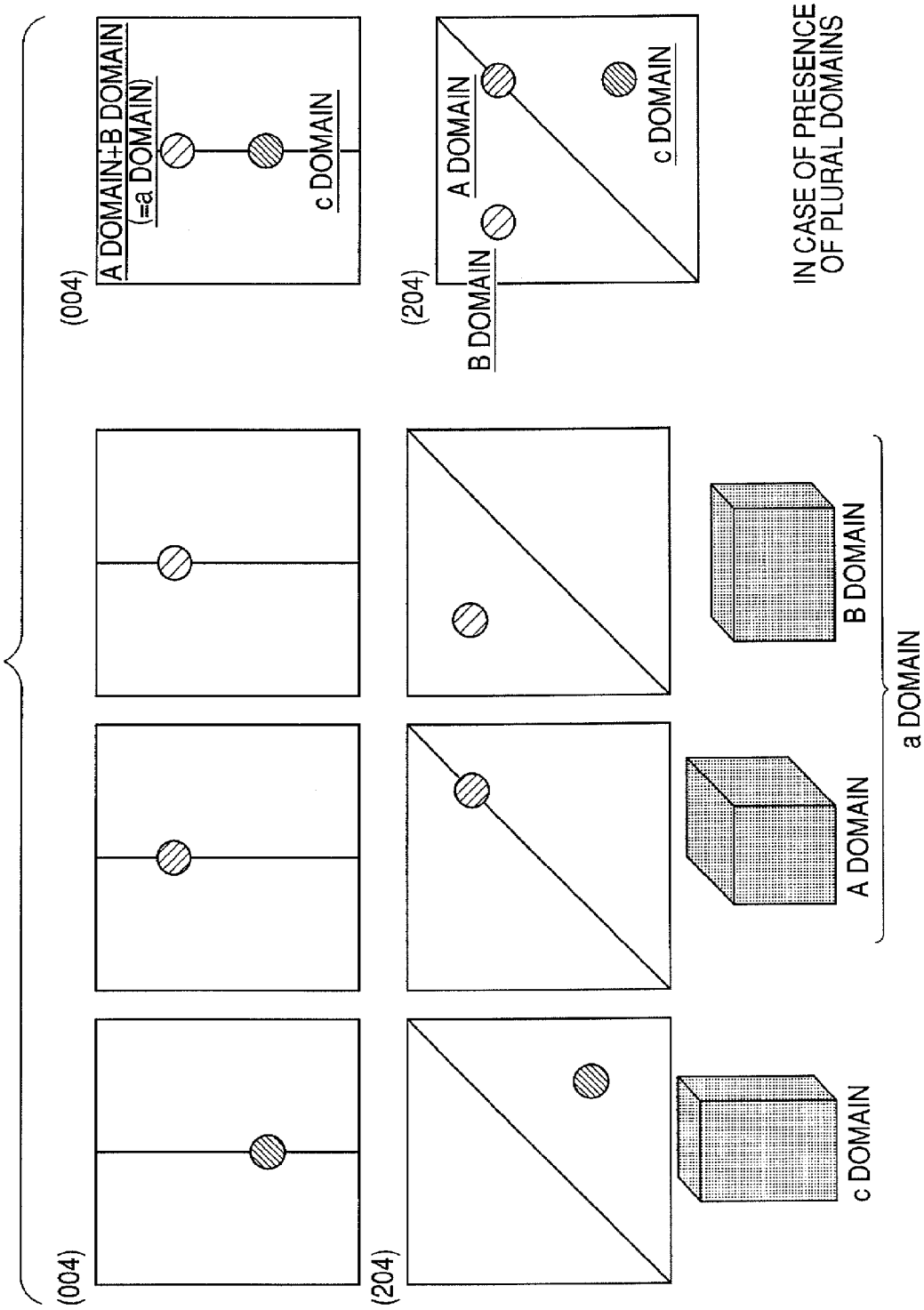
FIG. 5 is a view illustrating profiles of domain structures in the present invention, in reverse spatial maps.

FIG. 5 is a view illustrating a reverse lattice mapping measurement of a (004) plane and a (204) plane of a PZT piezoelectric film by X-ray diffractometry, on the piezoelectric element illustrated in FIG. 4 at a planar rotation angle φ of 0°. FIG. 5 indicates how a c-domain and an a-domain can be distinguished. The relation between c-domain and a-domain can be understood from the upper column views illustrating the reverse lattice mapping measurement of the (004) plane of the PZT piezoelectric film. Also the relation among c-domain, A-domain and B-domain can be understood from the lower column views illustrating the reverse lattice mapping measurement of the (204) plane of the PZT piezoelectric film.

Based on the reverse lattice mapping measurement on the (204) plane of the PZT piezoelectric film, the volume proportion $X_A$ (vol %) of the A-domains with respect to the sum of volumes of A-domains and B-domains can be calculated, with an integrated intensity O of diffracted X-ray of the A-domain and an integrated intensity P of diffracted X-ray of the B-domain, by a following equation (1):

$$X_A = 100 \times [O/(O+P)] \quad (1).$$

Based on the definition above, the volume of a-domains is the sum of the volumes of A-domains and B-domains. Therefore, a volume proportion $X_a$ (vol %) of a-domains with respect to the sum of volumes of a-domains and c-domains can also be calculated, utilizing the reverse lattice mapping measurement of the PZT (204) plane and the integrated intensity Q of diffracted X-ray of c-domains, by a following equation (2):

$$X_a = 100 \times [(O+P)/(O+P+Q)] \quad (2).$$

In the present invention, the piezoelectric film preferably has a film thickness of from 500 to 10,000 nm, and more preferably from 500 to 8,000 nm. A film thickness of the piezoelectric film equal to or larger than 500 nm provides, when the piezoelectric element is employed in an ink jet head, a durability against the stress generated by repeated drives, and a film thickness equal to or smaller than 10,000 nm can suppress generation of a film peeling.

The upper electrode 46 is disposed immediately on the piezoelectric film 45 and applies an electric field to the piezoelectric film in cooperation with the lower electrode. It is also possible to provide, between the upper electrode and the piezoelectric film, an adhesion layer of a material similar to that of the adhesion layer provided between the lower electrode and the vibration plate. The material constituting the upper electrode 46 may be similar to that of the lower electrode.

In such piezoelectric element of the present invention, examples of the specific layered structure are shown in the following. The layered structure is represented as:
upper electrode 46//piezoelectric film 45//lower electrode 44//buffer layer 43//vibration plate 42//substrate 41
in which "/" indicates a laminate structure.

Example 1

Pt/Ti (upper electrode 46)//PbZrTiO$_3$ (piezoelectric member 45)//Pt (lower electrode 44)//(LaNiO$_3$/CeO$_2$/YSZ (Y$_2$O$_3$—ZrO$_2$) (buffer layer 43)//Si/SiO$_2$ (vibration plate 42)//Si (substrate 41)

Example 2

SrRuO$_3$ (upper electrode 46)//PbZrTiO$_3$ (piezoelectric member 45)//SrRuO$_3$ (lower electrode 44)//(LaNiO$_3$/CeO$_2$/YSZ (Y$_2$O$_3$—ZrO$_2$) (buffer layer 43)//Si/SiO$_2$ (vibration plate 42)//Si (substrate 41)

Example 3

Pt/Ti (upper electrode 46)//PbZrTiO$_3$ (piezoelectric member 45)//SrRuO$_3$ (lower electrode 44)//(LaNiO$_3$/CeO$_2$/YSZ (Y$_2$O$_3$—ZrO$_2$) (buffer layer 43)//Si/SiO$_2$ (vibration plate 42)//Si (substrate 41)

Example 4

Pt/Ti (upper electrode 46)//PbZrTiO$_3$ (piezoelectric member 45)//Pt/SrRuO$_3$ (lower electrode 44)//(LaNiO$_3$/CeO$_2$/YSZ (Y$_2$O$_3$—ZrO$_2$) (buffer layer 43)//Si/SiO$_2$ (vibration plate 42)//Si (substrate 41)

In the foregoing examples, the function noted in each layer often overlaps and does not, therefore, restrict the function.

(Ink Jet Head)

The ink jet head of the present invention is characterized in including the above-described piezoelectric element of the present invention.

Figure 1:
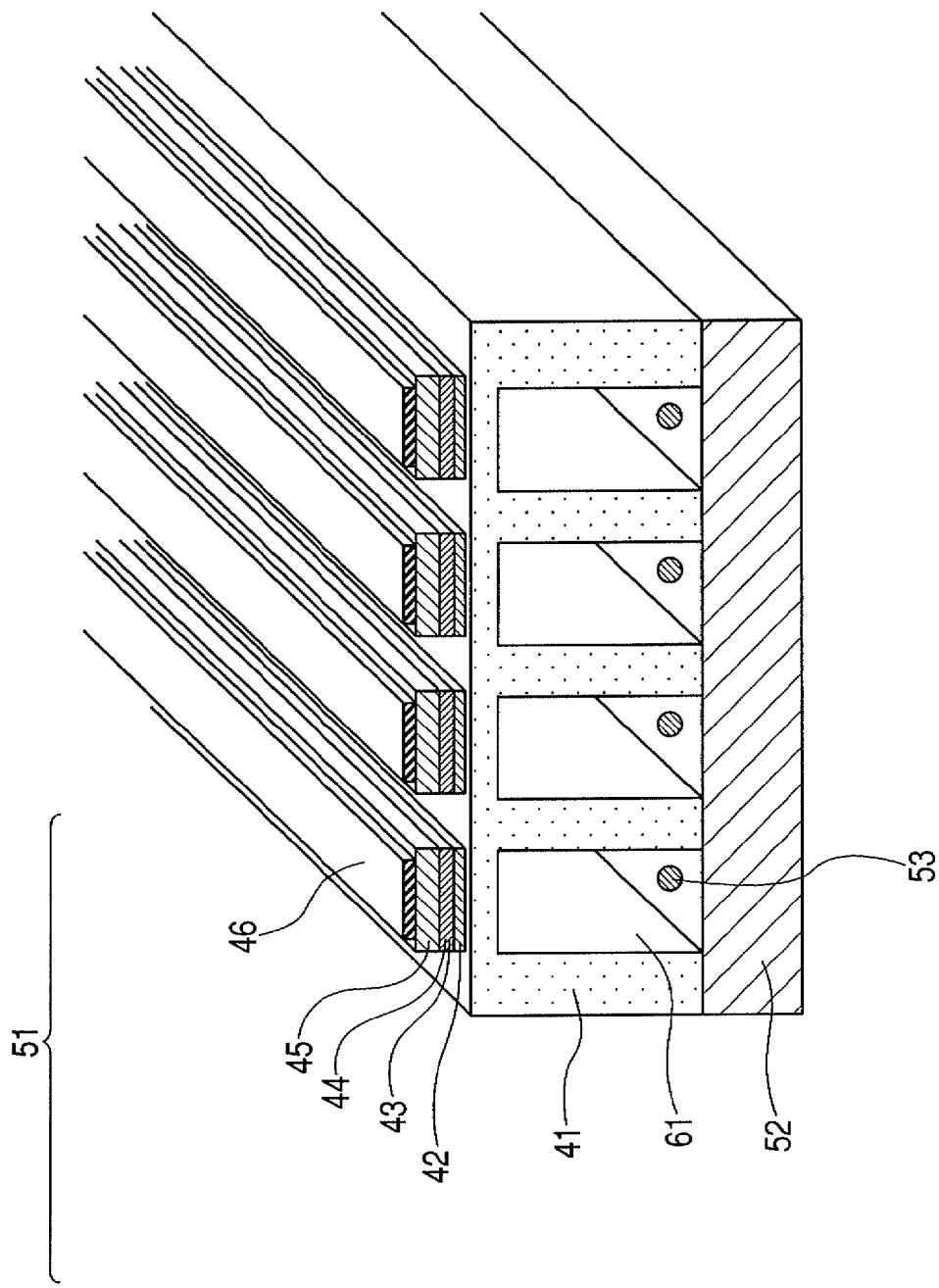
FIG. 1 is a schematic view illustrating a cross-sectional structure of an exemplary embodiment of an ink jet head of the present invention.

The ink jet head of the present invention is characterized in including the above-described piezoelectric element of the present invention and is not particularly restricted so far as it includes the piezoelectric element of the present invention, but an exemplary embodiment is illustrated in FIG. 1. The exemplary embodiment of the ink jet head illustrated in FIG. 1 includes a substrate 41, plural pressure chambers (liquid chambers) 61 disposed in a parallel array on the substrate 41, and a liquid discharge port (nozzle) 53 and a piezoelectric element 51 disposed corresponding to each pressure chamber 61. In such ink jet head, the liquid discharge ports 53 are formed with a predetermined pitch on a nozzle plate 52 disposed at the underside of the substrate 41, but may also be formed on a lateral side.

The piezoelectric element 51 is, for example, positioned in an aperture (not illustrated), formed on an upper face of the substrate 41 respectively corresponding to each pressure chamber 61, so as to close the aperture. Each piezoelectric element 51 may for example be a laminate member, formed by laminating a vibration plate 42, a buffer layer 43, a lower electrode 44, a piezoelectric film 45 and an upper electrode 46.

The ink jet head of the present invention includes a piezoelectric element having, in succession on a substrate 41, the vibration plate 42, the buffer layer 43, the lower electrode 44, the piezoelectric film 45 and the upper electrode 46 as films of aligned crystalline orientations as described above. The piezoelectric element includes a piezoelectric film formed by 90° domains having an anisotropy as described above. Such 90° domain having anisotropy includes A-domains having a normal axis of (001) plane substantially parallel to a shorter side direction of the pressure chamber of the substrate (principal bending direction). The A-domains have a volume proportion ($X_A$) larger than 50 vol %, and are formed in a larger proportion in comparison with B-domains which have a normal axis of (001) plane substantially parallel to a longer side direction (perpendicular to the principal bending direction). Therefore the ink jet head of the present invention can be equipped with a piezoelectric element exhibiting a larger displacement in comparison with a piezoelectric element including a piezoelectric film having isotropic 90° domains, thus exhibiting a larger discharge force.

(Producing Method for Piezoelectric Element)

The producing method for the piezoelectric element of the present invention includes following steps in succession: (a) a formation step of forming a piezoelectric film on a substrate; (b) an aperture step of forming a rectangular aperture on a surface of the substrate at a side where the piezoelectric film is not formed; and (c) a heating step of heating the substrate at a temperature higher than the substrate temperature at the formation step: wherein, in a stage prior to the heating step, the substrate has a linear thermal expansion coefficient larger than that of the piezoelectric film.

Examples of the producing method for the piezoelectric element of the present invention include a method utilizing thin film forming technologies.

In producing the piezoelectric element of the aforementioned structure, the vibration plate 42 may be produced by thin film forming processes such as a sputtering process, a CVD process, a laser ablation or pulsed laser deposition process (also represented as PLD process), and an MBE process. Particularly the sputtering process enables, by sufficiently heating the substrate during the film formation, to obtain a vibration plate 42 constituted of a thin oxide film epitaxially grown on the substrate 41.

The buffer layer 43 in the piezoelectric element may be produced, with a buffer material, by a method similar to the producing method for the electrodes to be described below.

In the production of the piezoelectric element, the lower electrode 44 to be laminated on the substrate 41 and the upper electrode 46 may be produced by thin film forming technologies such as a sputtering process, a CVD process, a PLD process, a sol-gel process, an MBE process and a hydrothermal synthesis process. These technologies enable to form crystals of the materials of the upper and lower electrode, with an orientation in a specified direction.

For forming the piezoelectric film 45 on the lower electrode 44, a piezoelectric film can be formed by a crystal growth, for example by a sputtering process, a CVD process, a sol-gel process, an MBE process or a hydrothermal synthesis process.

For forming the piezoelectric film 45 of the present invention, a method of growing respective crystalline phases by a sputtering process can be employed advantageously. In the preparation of the piezoelectric film 45 by such sputtering process, a piezoelectric material constituting the crystalline phase, for example a sintered substance, preferably an oxide represented by a following chemical formula (2), is advantageously employed as a target:

$$(Pb_{1-x}M_x)_{xm}(Zr_yTi_{1-y})O_z \qquad (2)$$

wherein M represents any one element selected from La, Ca, Ba, Sr, Bi, Sb, W and Nb; and x, xm, y and z represent real numbers respectively satisfying relations $0 \leq x < 0.4$, $1.0 \leq xm \leq 1.8$, $0.30 \leq y < 0.75$ and $2.5 \leq z \leq 3.0$.

Also the prepared piezoelectric film is preferably constituted of a crystalline phase of a composition of the chemical formula (2), in which x, xm, y and z represent real numbers respectively satisfying relations $0 \leq x < 0.2$, $1.0 \leq xm \leq 1.3$, $0.40 \leq y < 0.65$ and $2.5 \leq z \leq 3.0$.

In order to form the upper electrode 46 on the piezoelectric film 45, there may be employed for example a sputtering process, a CVD process, a sol-gel process, an MBE process, a PLD process, a hydrothermal synthesis process, a gaseous phase process such as an evaporation process, a printing process such as a screen printing process, or a liquid phase process such a plating process.

In order to form 90° domains having anisotropy in the piezoelectric film, the vibrating plate is formed by an etching, and then the piezoelectric film is subjected to a heating treatment at a temperature higher than the temperature of the substrate at the formation of the piezoelectric film. The etching may be executed for example by a wet etching process utilizing an anisotropic etching, an induction-coupled plasma process (also represented as ICP process), or a dry etching process such as Liga process or Bosch process. The heating is preferably executed for several hours in an oxygen atmosphere, utilizing an electric oven or a rapid transformation annealing apparatus (also represented as RTA apparatus).

(Producing Method for Ink Jet Head)

A representative example of the producing method of the present invention for an ink jet head is a producing method for ink jet head, including following steps: (A) a piezoelectric element producing step for producing a piezoelectric element on a substrate; (B) a pressure chamber forming step of providing a pressure chamber on the substrate; (C) an ink supply path forming step of providing an ink supply path in the substrate; (D) a liquid discharge port forming step of providing a liquid discharge port in the substrate; and (E) an adjoining step of adjoining members constituting the ink jet head, thereby assembling the ink jet head.

The aforementioned producing method of the present invention for the ink jet head is characterized in that the piezoelectric element producing step is a producing step utilizing the above-described producing method for the piezoelectric element of the present invention.

The producing method for the ink jet head of the present invention may be a method utilizing a thin film forming technology. For producing an ink jet head of the present invention, at first a piezoelectric element is produced on a substrate by the producing method for the piezoelectric element of the present invention. Then, for example on a rear side of the substrate on which the piezoelectric element is formed, desired portions, such as a pressure chamber 61 and an ink supply path, are formed, and a nozzle plate 52 is prepared by forming a liquid discharge port on another separate substrate and is adjoined to assemble the ink jet head. The ink jet head may also be produced by preparing another separate substrate including desired portions such as a pressure chamber, an ink supply path, a liquid discharge port and the like, and adjoining it with a piezoelectric element prepared by the producing method for the piezoelectric element of the present invention.

In the former method, a piezoelectric element is prepared by the producing method for the piezoelectric element of the present invention, and a part of the substrate 41 is removed by a dry etching with a predetermined pitch, thereby forming plural concave portions constituting the pressure chambers 61. For etching, there may be adopted a wet etching utilizing anisotropic etching, or a dry etching such as an ICP process, a LIGA process or a Bosch process. The shape of the pressure chamber may be suitably selected such as a rectangular shape, a circular shape or an oval shape, but a rectangular shape is preferred. Also in case of a side shooter configuration, the pressure chamber may have a constricted shape tapered toward the liquid discharge port. The ink jet head can be produced by adjoining, to the substrate bearing concave portions constituting the pressure chambers 61, a nozzle plate 52 prepared by forming liquid discharge ports 53 on another substrate, or a nozzle plate prepared by forming liquid discharge ports 53 and ink supply paths on another substrate. The material of the substrate for preparing the nozzle plate may be same as or different from the material of the substrate to be adjoined, and may be, for example, SUS or Ni. The material of the substrate for preparing the nozzle plate preferably has, with respect to the substrate to be adjoined thereto, a difference in the linear thermal expansion coefficient of from $1 \times 10^{-6}/°C$. to $1 \times 10^{-8}/°C$. Examples of the method for forming the liquid discharge port in the substrate include an etching, a mechanical working and a laser working.

The substrate 41 and the nozzle plate 52 may be adjoined by a method utilizing an organic adhesive, but are preferably adjoined by a solid phase adjoining, utilizing an inorganic material. Examples of the material to be used in the solid phase adjoining include Si, In, Au, Cu, Ni, Pb, Ti and Cr. Such adjoining may be executed, for example, by a method of adjoining the substrate and the nozzle plate under a pressure of 2 MPa and at a low temperature of 250° C. or less, or a method of activating each adjoining surface of the substrate and the nozzle plate for example by an Ar plasma and pressing the adjoining surfaces with each other in a high vacuum and at the normal temperature thereby obtaining a firm adjoining. The solid phase adjoining is advantageous in avoiding drawbacks such as bending of the piezoelectric element and in suppressing the damage to the piezoelectric element, when the difference in the thermal expansion coefficient from the substrate is small and when the dimension is made longer.

EXAMPLES

In the following, the piezoelectric element of the present invention and the ink jet head utilizing the piezoelectric element of the present invention will be described in detail by examples, but the present invention is not limited to such examples.

Example 1

An ink jet head of a construction illustrated in FIG. 1 was prepared in the following manner. At first, a sputtering apparatus was used to form, on a Si substrate, in succession an epitaxial stabilized zirconia YSZ ($Y_2O_3$—$ZrO_2$) film, an epitaxial $CeO_2$ film and an epitaxial $SrTiO_3$ film, thereby preparing a buffer layer (serving also as a vibration plate).

In this operation, the epitaxial stabilized zirconia YSZ ($Y_2O_3$—$ZrO_2$) film was prepared under conditions of a Si substrate temperature of 800° C., Ar and $O_2$ as process gasses, an electric power of 60 W applied between the Si substrate and the target, and a pressure of 1.0 Pa in the apparatus. Thus an epitaxial stabilized zirconia YSZ ($Y_2O_3$—$ZrO_2$) film of a thickness of 200 nm was obtained.

Also the epitaxial $CeO_2$ film was prepared under conditions of a Si substrate temperature of 800° C., Ar and $O_2$ as process gasses, an electric power of 80 W applied between the Si substrate and the target, and a pressure of 0.5 Pa in the apparatus. Thus an epitaxial $CeO_2$ film of a thickness of 200 nm was obtained.

The epitaxial $SrTiO_3$ film was prepared under conditions of a Si substrate temperature of 600° C., Ar and $O_2$ as process gasses, an electric power of 100 W applied between the Si substrate and the target, and a pressure of 0.3 Pa in the apparatus. Thus an epitaxial $SrTiO_3$ film of a thickness of 2000 nm was obtained.

Then on the buffer layer (serving also as a vibration plate), a lower electrode was prepared utilizing Pt as a target and by a method similar to that for producing the buffer layer (serving also as the vibration plate) (step (1) in FIG. 6 and FIG. 7 (a)). In this operation, the lower electrode was prepared under conditions of a substrate temperature of 600° C., Ar as process gas, an electric power of 100 W applied between the buffer layer and the target, and a pressure of 0.5 Pa in the apparatus. Thus a Pt film (lower electrode) of a single high orientation, having a thickness of 400 nm was obtained.

Thereafter, a piezoelectric film was prepared on the lower electrode, utilizing the aforementioned sputtering apparatus (step (2) in FIG. 6 and FIG. 7 (b)). The piezoelectric film was prepared under conditions of a substrate temperature of 550° C., Ar and as process gasses, an electric power of 100 W applied between the lower electrode and the target, and a pressure of 0.5 Pa in the apparatus. Also a target having a formulation represented by the following chemical formula (3) was employed:

$$(Pb_{1-x}M_x)_{xm}(Zr_yTi_{1-y})O_3 \qquad (3)$$

wherein M represents La; and x=0.06, xm=1.10, and y=0.52.

Figure 7A:
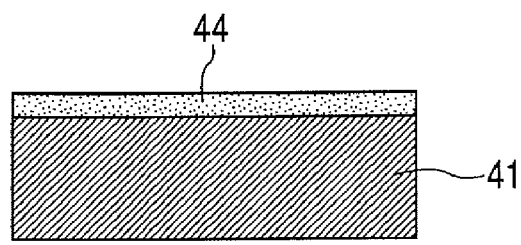
FIGS. 7A, 7B, 7C, 7D and 7E are cross-sectional views illustrating the production process of the present invention.
Figure 7B:
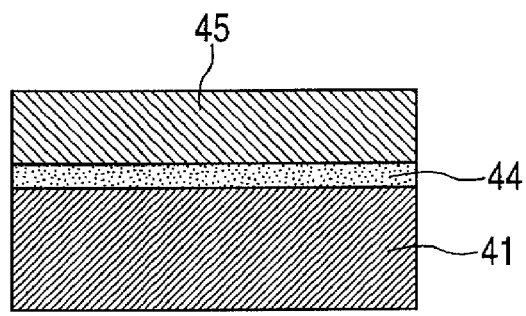
Figure 7C:
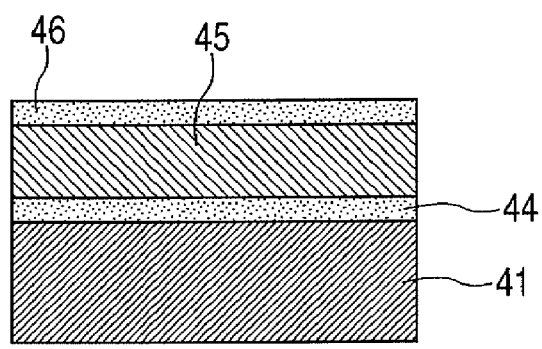
Figure 7D:
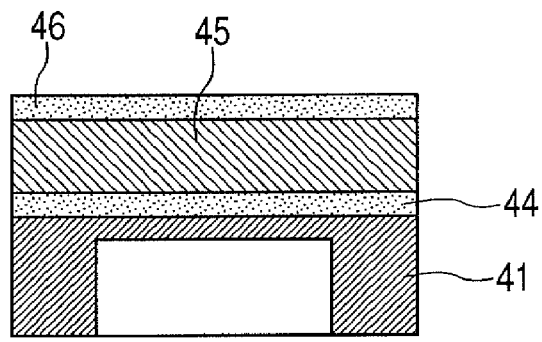

Thereafter, an upper electrode was prepared by a method similar to that for the lower electrode (step (3) in FIG. 6 and FIG. 7C). Then an ICP dry etching was executed on a surface of the Si substrate, opposite to the surface bearing the vibration plate 42, to eliminate a central portion thereby forming a thin portion (also represented as a concave portion) (depth: 200 μm, width: 70 μm (corresponding to 180 dpi, pitch: 141 μm), length: 3 mm, thickness of thin portion: 3 μm) (step (4) in FIG. 6 and FIG. 7D). This operation was conducted under conditions of a substrate temperature of 20° C., $SF_6$ and $C_4F_8$ as gasses used, a high-frequency coil being driven by a high frequency (also represented as RF) with an output of 1800 W, and a pressure of 4.0 Pa in the apparatus.

Figure 7E:
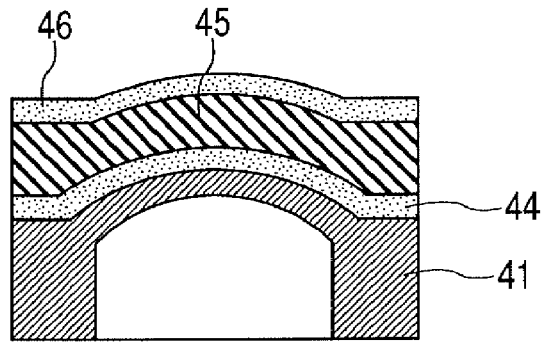

Thereafter a heating treatment was executed with an RTA apparatus, in an oxygen atmosphere and at a substrate temperature of 700° C. which was higher than the film forming temperature at the formation of the piezoelectric film (step (5) in FIG. 6 and FIG. 7E), thereby obtaining a piezoelectric element.

The piezoelectric film after the heat treatment of the piezoelectric element was subjected to an evaluation of domains. The evaluation of domains was conducted by a reverse lattice mapping of X-ray diffractometry, as described above, on (004) plane and (204) plane of the piezoelectric film crystals. A volume proportion ($X_A$ (vol %)) of the A-domains with respect to the sum of the volumes of A-domains and B-domains was calculated according to the following formula (1):

$$X_A = 100 \times [O/(O+P)] \qquad (1).$$

The piezoelectric film of the piezoelectric element had $X_A$ of 80 vol %.

Then, liquid discharge ports of ϕ30 μm were formed on a Si substrate to prepare a Si nozzle plate having liquid discharge ports 53. This nozzle plate was adjoined to the aforementioned Si substrate having the concave portions on the rear side, by a Si—Si adjoining (adjoining being realized by adhering a Si surface activated by Ar plasma with another similarly activated Si surface, at the normal temperature and under a high vacuum of $10^{-6}$ Pa), thereby preparing an ink jet head. The obtained ink jet head had pressure chambers of a length (longer side direction) of 3 mm and a width (shorter side direction) of 70 μm.

The obtained piezoelectric element was subjected (at the preparation of ink jet head, in state without ink) to a voltage application of a voltage of 20 V and a frequency of 10 kHz, and a displacement amount at the central position of the concave portion (namely at the center of the width of 70 μm and at the center of the length of 3 mm) was measured by a laser Doppler displacement meter. Also on thus obtained ink jet head, a discharge amount and a discharge velocity were measured by synchronizing a discharged liquid droplet and an input signal and by observing the liquid droplet and the size thereof by a CCD. In this operation, a voltage of 20 V and a frequency of 10 kHz was applied to the ink jet head, as in the case of the piezoelectric element described above. The obtained results are described in Tables 1 and 2.

Example 2

A piezoelectric element and an ink jet head were prepared in the same manner as in Example 1, except for employing a target represented by a following chemical formula (4):

$$(Pb_{1-x}M_x)_{xm}(Zr_yTi_{1-y})O_3 \qquad (4)$$

wherein M represents La; and x=0.06, xm=1.10, and y=0.40, and there were measured, as in Example 1, a volume proportion $X_A$ of the A-domains with respect to the sum of the volumes of A-domains and B-domains in the piezoelectric film, and a discharge amount and a discharge velocity of the liquid droplet from the ink jet head. The piezoelectric film had $X_A$ of 80 vol %. Also the results of measurements of the discharge amount and the discharge velocity of the liquid droplet from the ink jet head are described in Tables 1 and 2.

Comparative Example 1

A piezoelectric element and an ink jet head were prepared in the same manner as in Example 1, except for employing a target represented by a following chemical formula (5):

$$(Pb_{1-x}M_x)_{xm}(Zr_yTi_{1-y})O_3 \qquad (5)$$

wherein M represents La; and x=0.06, xm=1.10, and y=0.40, and except for executing, after the heating treatment with the RTA apparatus, an ICP dry etching on a Si substrate surface, opposite to the surface bearing the vibration plate 42, to eliminate a central portion to form a concave portion, and there were measured, as in Example 1, a volume proportion $X_A$ of the A-domains with respect to the sum of the volumes of A-domains and B-domains in the piezoelectric film, and a discharge amount and a discharge velocity of the liquid droplet from the ink jet head. The piezoelectric film had $X_A$ of 50 vol %. Also the results of measurements of the discharge amount and the discharge velocity of the liquid droplet from the ink jet head are described in Tables 1 and 2.

TABLE 1

|  | Example 1 | Example 2 | Comp. Ex. 1 |
|---|---|---|---|
| $X_A$ of piezoelectric film (vol %) | 80 | 80 | 50 |
| displacement (nm) | 200 | 170 | 50 |

As described in Table 1, the piezoelectric films of the piezoelectric elements of Examples 1 and 2 had a volume proportion $X_A$ of the A-domains of 80 vol % with respect to the sum of the volumes of A-domains and B-domains. Also the piezoelectric film of the piezoelectric element of Comparative Example 1 had $X_A$ of 50 vol %. The piezoelectric elements of Examples 1 and 2, having larger volume proportions $X_A$ of A-domains, provided displacements larger than that of the piezoelectric element of Comparative Example 1, thus exhibiting an excellent performance.

TABLE 2

|  | Example 1 | Example 2 | Comp. Ex. 1 |
|---|---|---|---|
| $X_A$ of piezoelectric film (vol %) | 80 | 80 | 50 |
| discharge amount (pl) | 15 | 14 | 12 |
| discharge velocity (m/sec) | 11 | 9 | 6 |

As described in Table 2, the ink jet heads of Examples 1 and 2 showed larger discharge amounts and larger discharge velocities under application of a voltage of 20 V, 10 kHz in comparison with the ink jet head of Comparative Example 1, thus exhibiting excellent performance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-194699, filed Jul. 14, 2006, which is hereby incorporated by reference herein in its entirety.

What is claimed is:
1. A piezoelectric element comprising a piezoelectric film disposed on a substrate and a pair of electrodes disposed in contact with the piezoelectric film and utilizing a bending mode,
wherein the piezoelectric film includes domains constituted of a tetragonal crystal and including an a-domain which is formed by a crystal having a (100) plane parallel to the film surface of the piezoelectric film,
the a-domains include an A-domain having a normal axis of (001) plane substantially parallel to a principal bending direction of the piezoelectric film and a B-domain having a normal axis of (001) plane substantially perpendicular to the principal bending direction of the piezoelectric film, and the A-domains have a volume proportion larger than 50 vol % with respect to the sum of the volume of the A-domains and the volume of the B-domains.

2. A piezoelectric element according to claim 1, wherein the domains constituted of a tetragonal crystal further comprise a c-domain which is formed by a crystal having a (001) plane parallel to the film surface of the piezoelectric film.

3. A piezoelectric element according to claim 1, wherein the principal bending direction of the piezoelectric film is a shorter side direction of the piezoelectric film.

4. A piezoelectric element according to claim 1, wherein the piezoelectric film has a thickness of from 500 to 10,000 nm.

5. An ink jet head comprising a liquid chamber communicating with a discharge port for discharging ink, and a piezoelectric element according to claim 1, provided corresponding to the liquid chamber, for generating energy for discharging the ink.

6. A producing method for a piezoelectric element including a piezoelectric film disposed on a substrate and a pair of electrodes disposed in contact with the piezoelectric film, the method comprising:

forming the piezoelectric film on the substrate;

forming a rectangular aperture on a surface of the substrate at a side where the piezoelectric film is not formed; and heating the substrate at a temperature higher than the substrate temperature at the formation of the piezoelectric film, wherein, prior to the heating, the substrate has a linear thermal expansion coefficient greater than that of the piezoelectric film.

\* \* \* \* \*